(12) United States Patent
Zeng et al.

(10) Patent No.: US 11,061,315 B2
(45) Date of Patent: Jul. 13, 2021

(54) HYBRID OPTICAL AND EUV LITHOGRAPHY

(71) Applicant: GLOBALFOUNDRIES U.S. Inc., Malta, NY (US)

(72) Inventors: Jia Zeng, Sunnyvale, CA (US); Guillaume Bouche, Albany, NY (US); Lei Sun, Altamont, NY (US); Geng Han, Fishkill, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 131 days.

(21) Appl. No.: 16/191,589

(22) Filed: Nov. 15, 2018

(65) Prior Publication Data
US 2020/0159105 A1 May 21, 2020

(51) Int. Cl.
*H01L 21/00* (2006.01)
*G03F 1/24* (2012.01)
(Continued)

(52) U.S. Cl.
CPC ............ *G03F 1/24* (2013.01); *H01L 21/0337* (2013.01); *H01L 21/0338* (2013.01);
(Continued)

(58) Field of Classification Search
None
See application file for complete search history.

(56) References Cited

U.S. PATENT DOCUMENTS 6,573,997 B1 6/2003 Goldberg et al.
6,623,895 B2 9/2003 Chen et al.
(Continued)

FOREIGN PATENT DOCUMENTS

TW I594317 B 8/2017
TW 201825298 A 7/2018
TW 201921695 A 6/2019

OTHER PUBLICATIONS

Lariviere et al., "Electrical Comparison of iN7 EUV Hybrid and EUV Single Patterning BEOL Metal Layers," SPIE Advanced Lithography, 2018, pp. 1-14.
(Continued)

*Primary Examiner* — Reema Patel
(74) *Attorney, Agent, or Firm* — Gibb & Riley, LLC; Anthony J. Canale

(57) ABSTRACT

Methods pattern a sacrificial material on an etch mask into mandrels using optical mask lithography, form a conformal material and a fill material on the mandrels, and planarize the fill material to the level of the conformal material. Such methods pattern the fill material into first mask features using extreme ultraviolet (EUV) lithography. These methods partially remove the conformal material to leave the conformal material on the sidewalls of the mandrels as second mask features. Spaces between the first mask features and the second mask features define an etching pattern. The spacing distance of the mandrels is larger than the spacing distance of the second mask features. Such methods transfer the etching pattern into the etch mask material, and subsequently transfer the etching pattern into an underlying layer. Openings in the underlying layer are filled with a conductor to form wiring in the etching pattern.

20 Claims, 13 Drawing Sheets

(51) Int. Cl.
    *H01L 21/033*      (2006.01)
    *H01L 21/311*      (2006.01)
    *H01L 21/3213*     (2006.01)
    *H01L 21/308*      (2006.01)

(52) U.S. Cl.
    CPC ...... *H01L 21/3086* (2013.01); *H01L 21/3088* (2013.01); *H01L 21/31144* (2013.01); *H01L 21/32139* (2013.01)

(56) References Cited

U.S. PATENT DOCUMENTS

| | | |
|---|---|---|
| 6,737,201 B2 | 5/2004 | Shoki et al. |
| 6,749,973 B2 | 6/2004 | Shoki et al. |
| 6,986,971 B2 | 1/2006 | Han et al. |
| 7,023,528 B2 | 4/2006 | Hsu et al. |
| 8,202,681 B2 | 6/2012 | Lin et al. |
| 9,046,754 B2 | 6/2015 | Sewell et al. |
| 9,177,797 B2 | 11/2015 | Chang et al. |
| 9,466,486 B2 | 10/2016 | Shieh et al. |
| 9,941,164 B1 * | 4/2018 | Kim .................... H01L 21/3083 |
| 2006/0251973 A1 | 11/2006 | Takaki et al. |
| 2014/0302678 A1 | 10/2014 | Paterson et al. |
| 2017/0338116 A1 * | 11/2017 | deVilliers ........... H01L 21/0332 |

OTHER PUBLICATIONS

TW Application No. 108137058, Examination Report dated Oct. 29, 2020 and Search Report dated Oct. 7, 2020, pp. 1-4.
Taiwanese Application No. 108137058, Notice of Allowance dated May 4, 2021, pp. 1-3.

* cited by examiner

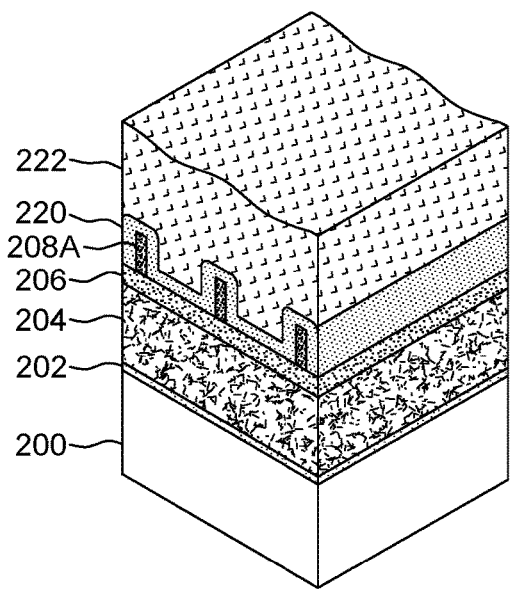
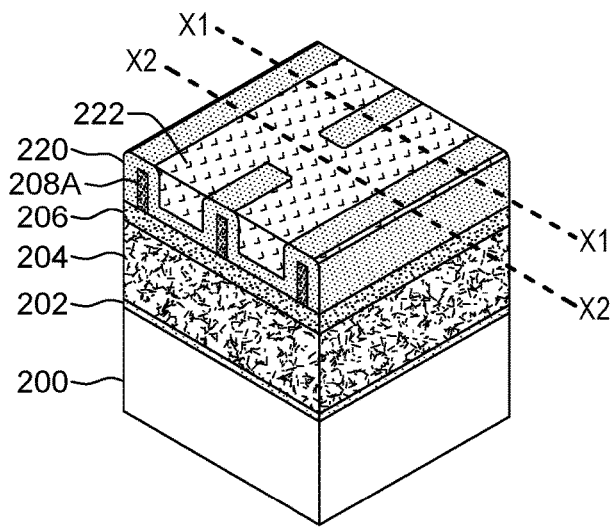
FIG. 6    FIG. 7A
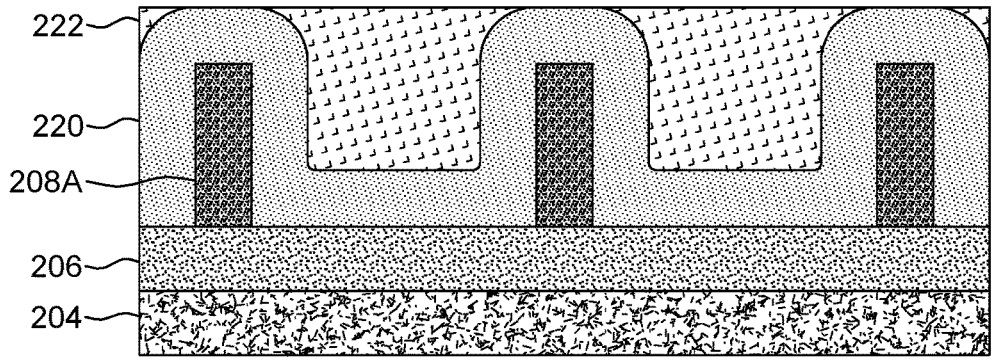
FIG. 7B
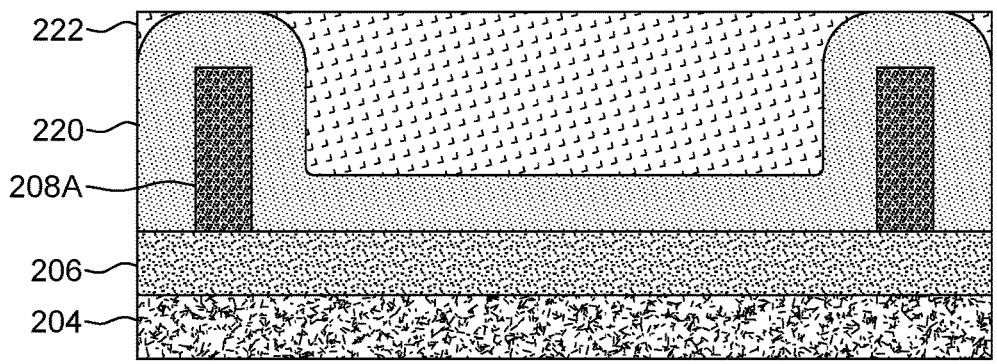
FIG. 7C

HYBRID OPTICAL AND EUV LITHOGRAPHY

BACKGROUND

Field of the Invention

The present disclosure relates to systems and methods that form components of integrated circuit devices, and resulting structures, and more specifically to the use of multiple lithographic components to increase pitch resolution.

Description of Related Art

The ability to reduce the size of components within integrated circuit devices makes the integrated circuit devices smaller, lighter, and less expensive by reducing consumption of manufacturing materials. In addition, the components within smaller integrated circuit devices are closer together which increases the speed at which the device operates and reduces the power consumption of such devices, and the reduced size of integrated circuit devices increases storage capacity per unit area.

Therefore, there are many advantages to reducing the size of integrated circuit devices and advances have been made in the manufacturing process toward that end. One such advance has been the utilization of extreme ultraviolet (EUV) lithography, which uses the concepts reflection and interfering light patterns to reduce the size of features formed lithographically. EUV lithography utilizes a reflective surface that has light absorbing features thereon that change the way in which the light is reflected to pattern features on layers of integrated circuit devices.

However, EUV lithography can incur light scattering, which can reduce resolution by making some features blurry or unclear. In contrast, optical lithography which involves casting a shadow by blocking light passing through a non-reflective light-blocking optical mask can produce sharper, crisper, less blurry features. However, because of limitations created by the wavelengths of light, optical lithography cannot produce features as small as EUV lithography can.

SUMMARY

Various methods herein pattern a sacrificial material on an etch mask material into mandrels using non-reflective light-blocking mask optical lithography. The etch mask material is on an underlying layer that will eventually be patterned. Such methods form a conformal material on the mandrels and the etch mask material, form a fill material on the conformal material, and planarize the fill material to the level of the conformal material.

Next, these methods pattern the fill material into first mask features using extreme ultraviolet (EUV) reflective mask lithography, to leave the fill material between locations of the mandrels. Sidewall spacers are formed in a controlled material removal process that partially removes the conformal material to leave the conformal material on the sidewalls of the mandrels as second mask features. The mandrels are then removed in a selective etching process. Spaces between the first mask features and the second mask features define an etching pattern. The spacing distance of the mandrels is larger than the spacing distance of the second mask features and, in one example, the spacing distance of the mandrels can be twice as large as the spacing distance of the second mask features. Also, in the etching pattern, some of the first mask features can be between and parallel to the second mask features, and some of the first mask features can be co-linear with the second mask features.

Methods herein remove portions of the etch mask material not protected by the first mask features and the second mask features to transfer the etching pattern into the etch mask material. These methods remove the first mask features and second mask features and then etch the underlying layer through the etching pattern in the etch mask material to transfer openings matching the etching pattern into the underlying layer. Such methods fill the openings in the underlying layer with a conductor to form wiring in the underlying layer having a wiring pattern matching the etching pattern.

The resolution of the optical lithography is higher than the resolution of the EUV lithography, which results in irregularities in the wiring pattern in the underlying layer because some of the sidewalls of the wires in the wiring pattern are patterned according to the higher-resolution optical lithography, while other sidewalls are patterned with the lower resolution EUV lithography. Therefore, these methods produce integrated circuit structures that include, among other components, a wiring layer within a plurality of laminated layers. The wiring layer has wiring lines within an insulator and a liner between the insulator and the wiring lines. In one example, the wiring lines can include what are referred to as wider "first" conductive lines and relatively narrower "second" conductive lines, where the first conductive lines have a larger number of irregularities relative to the second conductive lines. In one example, the pitch of the first conductive lines is 1.5 times a pitch of the second conductive lines.

More specifically, such larger number of irregularities includes inconsistently shaped sidewalls along lengths of the first conductive lines relative to shapes of sidewalls of the second conductive lines. Also, the first conductive lines can have less consistent widths relative to widths of the second conductive lines. With respect to this larger number of irregularities, certain ones of the narrower second conductive lines can have one sidewall (that is formed with EUV lithography) that has a larger number of irregularities, but a second sidewall (formed with optical lithography) that lacks such a larger number of irregularities.

Various systems herein include, among other components, an optical mask lithography station configured to pattern a sacrificial material on an etch mask material into mandrels, wherein the etch mask material is on an underlying layer. Another component of these systems is at least one material addition station, which can be configured as an atomic layer deposition (ALD) station that forms a conformal material on the mandrels and the etch mask material. Such material addition station(s) can also be configured to form a fill material on the conformal material. These systems have a planarization station configured to planarize the fill material to a level of the conformal material. Also included is an extreme ultraviolet (EUV) mask lithography station configured to pattern the fill material into first mask features and this leaves the fill material between locations of the mandrels. Such systems further include at least one material removal station configured to partially remove the conformal material to leave the conformal material on sidewalls of the mandrels as second mask features. The first mask features can be formed parallel to the second mask features, and the first mask features can be formed co-linear with the second mask features.

Further, the material removal station is configured to remove the mandrels. The spaces between the first mask features and the second mask features define an etching pattern. The material removal station is configured to remove portions of the etch mask material not protected by the first mask features and the second mask features to transfer the etching pattern into the etch mask material. The material removal station is also configured to remove the first mask features and second mask features and to etch the underlying layer through the etching pattern in the etch mask material to transfer openings matching the etching pattern into the underlying layer. The material addition station is configured to fill the openings with a conductor to form wiring in the underlying layer having a wiring pattern matching the etching pattern.

A first spacing distance of the mandrels is larger than a second spacing distance of the second mask features. In one example, such first spacing distance of the mandrels is twice as large as a second spacing distance of the second mask features. In another example, the first spacing distance of the mandrels is 3 times larger than spacing distance of the etching pattern, and the second spacing distance of the second mask features is 1.5 times larger than the spacing distance of the etching pattern.

BRIEF DESCRIPTION OF THE DRAWINGS

The embodiments herein will be better understood from the following detailed description with reference to the drawings, which are not necessarily drawn to scale and in which:

FIG. 6 is a conceptual schematic perspective view of a partially complete structure produced by methods and systems herein;

FIG. 7A is a conceptual schematic perspective views of a partially complete structure produced by methods and systems herein;

FIGS. 7B and 7C are conceptual schematic cross-sectional views along lines X1-X1 and X2-X2 in FIG. 7A of partially complete structures produced by methods and systems herein;

DETAILED DESCRIPTION

As mentioned above, the utilization of extreme ultraviolet (EUV) lithography has allowed the size of integrated circuit devices to be reduced; however, EUV lithography can incur light scattering, which can reduce resolution. In order to maintain the advantages of both optical lithography and EUV lithography, the systems and methods disclosed herein utilize sidewall spacers formed on features patterned with optical lithography (e.g., sidewall image transfer (SIT) techniques) in combination with features patterned using EUV lithography in a specific pitch ratio in order to produce high-resolution, crisp features with sizes comparable to features produced by leading edge EUV-only lithography systems. This allows the systems and methods herein to pattern features that are as small as EUV-only lithography patterned features, while still maintaining the higher resolution produce by optical lithography systems.

Figure 1:
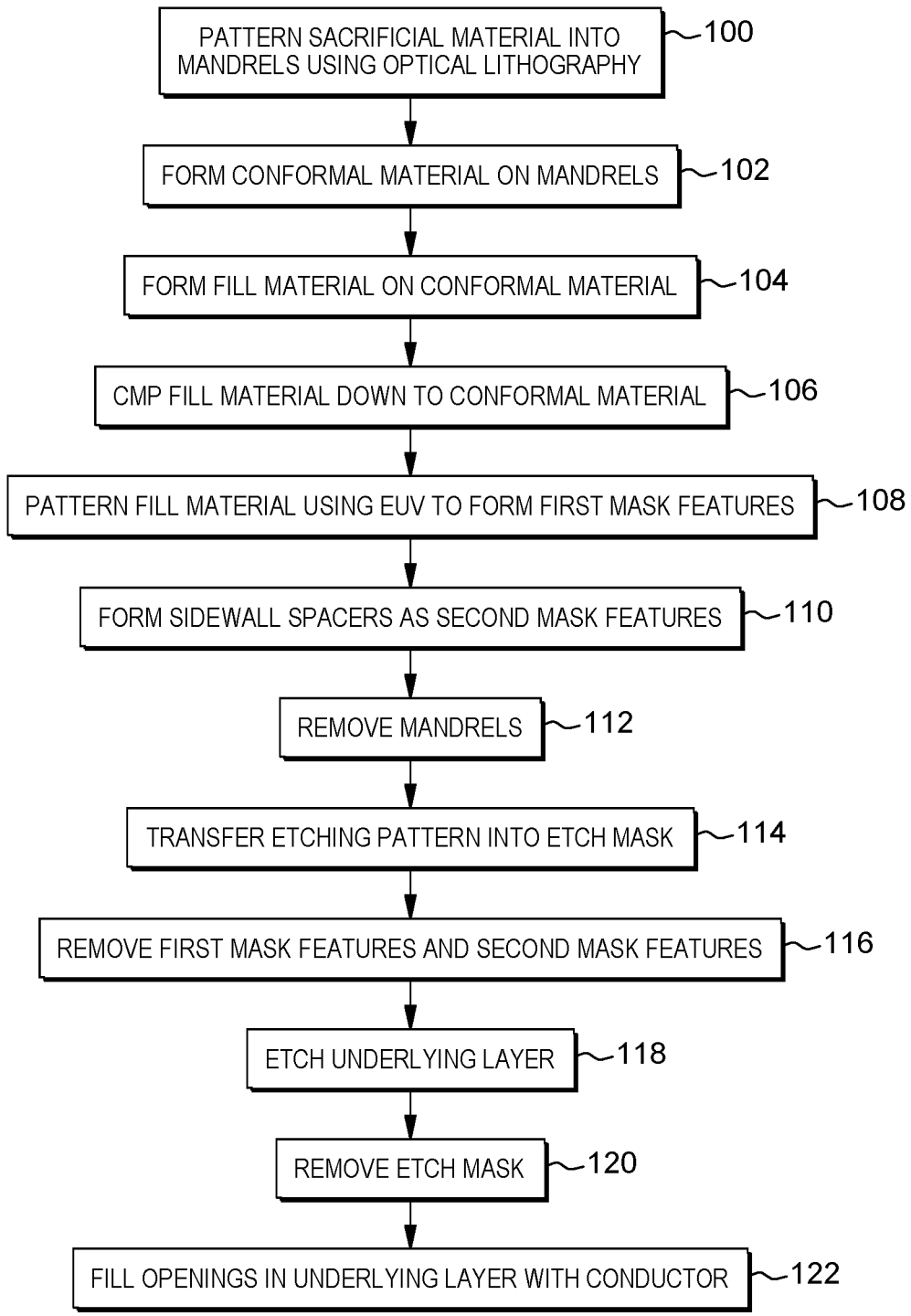
FIG. 1 is a flow diagram illustrating embodiments herein.

FIG. 1 is a flowchart illustrating aspects of various methods herein. In item 100, such methods pattern a sacrificial material on an etch mask material into mandrels using non-reflective light-blocking mask optical lithography. The etch mask material is previously formed (deposited or grown) on an underlying dielectric layer that will eventually be patterned. In item 102, such methods form a conformal material on the mandrels and the etch mask material. Item 102 uses a conformal formation process, such as atomic layer deposition (ALD, etc.). In item 104, these methods form a fill material on the conformal material by growing or depositing the fill material to at least fill the spaces between the mandrels. Item 106 shows that such methods can planarize (e.g., in CMP processing) the fill material down to the level of the conformal material to leave the fill material only between the mandrels.

Next, in item 108, these methods pattern the fill material into first mask features using reflective mask extreme ultraviolet (EUV) lithography, to leave the fill material between locations of the mandrels. In item 110, sidewall spacers are formed in a controlled material removal process that partially removes the conformal material to leave the conformal material on the sidewalls of the mandrels as second mask features. In item 112, the mandrels are then removed in a selective etching process (e.g., sidewall image transfer (SIT) techniques). Spaces between the first mask features and the second mask features define the openings, or spaces, in an etching pattern. The spacing distance of the mandrels is larger than the spacing distance of the second mask features and, in one example, the spacing distance of the mandrels can be twice as large as the spacing distance of the second mask features. Also, in the etching pattern, some of the first mask features can be between and parallel to the second mask features, and some of the first mask features can be co-linear with the second mask features.

In item 114, methods herein remove portions of the etch mask material not protected by the first mask features and the second mask features to transfer the etching pattern into the etch mask material. These methods remove the first mask features and second mask features in item 116. In item 118, such methods etch the underlying layer through the etching pattern in the etch mask material to transfer openings matching the etching pattern into the underlying layer. In item 120 the etch mask material is removed. In item 122, such methods fill the openings in the underlying layer with a conductor to form wiring in the underlying layer having a wiring pattern matching the etching pattern.

Figure 2:
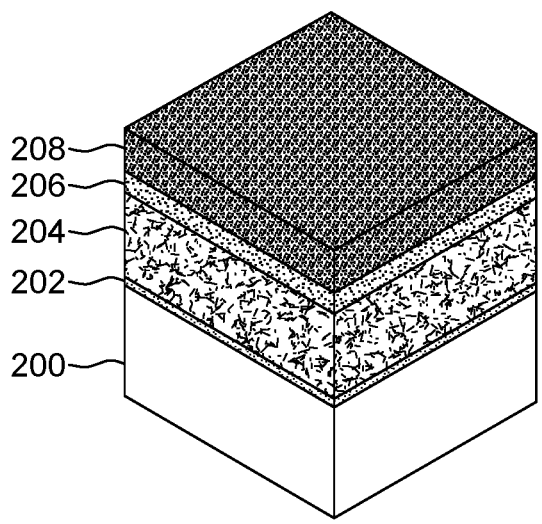
FIGS. 2 and 3 are conceptual schematic perspective views of partially complete structures produced by methods and systems herein.

Some specific examples of such processing are shown in FIGS. 2-14. More specifically, FIG. 2 is a conceptual schematic perspective view of a partially complete structure that shows processing herein forms a laminated structure by sequentially forming various materials including a base layer 200 (which can be a bulk substrate, etc.), forming (growing or depositing) an isolation layer 202 (e.g., oxide, etc.) on the base layer 200, forming (growing or depositing) an underlying insulator layer 204 (e.g., titanium oxide, etc.) on isolation layer 202, forming a hardmask layer 206 (e.g., silicon nitride, etc.) on the underlying insulator layer 204, and forming (growing or depositing) a first selectively removable sacrificial layer 208 (e.g., asymmetric silicon, etc.) on the hardmask layer 206 to produce the structure shown in FIG. 2. While some materials are mentioned as examples herein, as would be understood by those ordinarily skilled in the art, any materials that are selectively removable relative to one another can be used in place of the foregoing exemplary materials. Additionally, various cleaning/planarization steps can be performed between the formation of the foregoing layers, if needed/desired.

Figure 3:
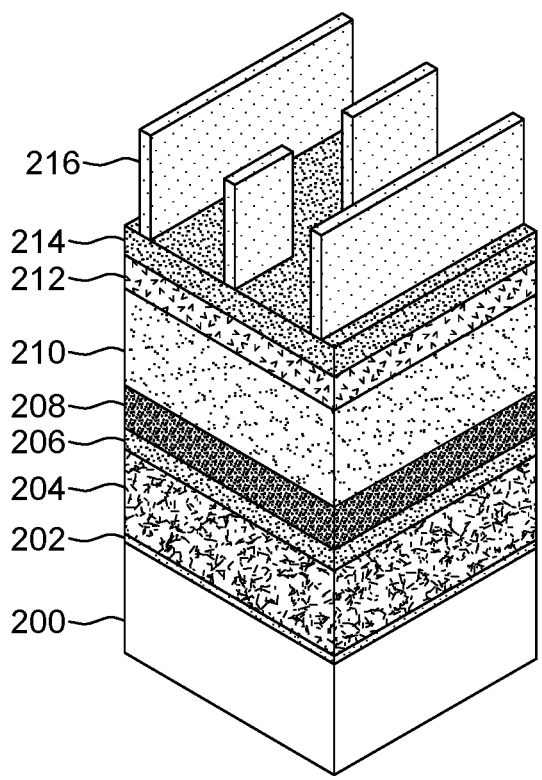

FIG. 3 is a conceptual schematic perspective view of a partially complete structure that shows methods herein pattern the asymmetric silicon layer 208 on the silicon nitride layer 206 into mandrels using various non-reflective light-blocking mask optical lithography layers 210-216. In FIG. 3, a pattern optically developed in a photoresist layer 216 is transferred through supporting layers 210, 212, 214 to the asymmetric silicon layer 208 using various material removal processes, such as etching, etc.

Figure 4A:
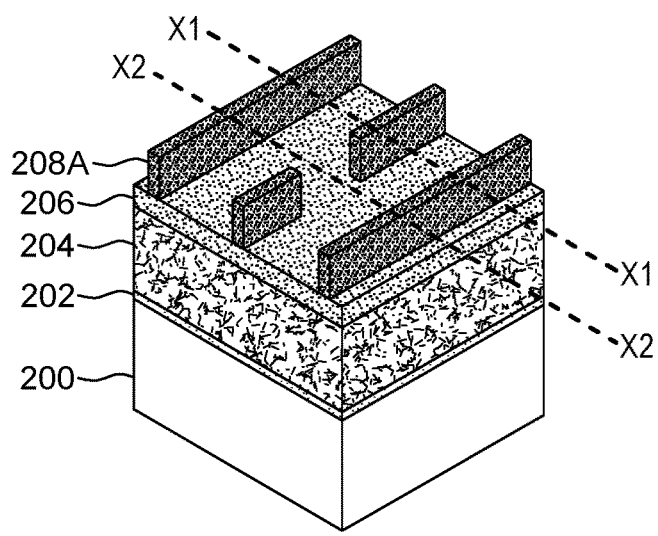
FIG. 4A is a conceptual schematic perspective view of a partially complete structure produced by methods and systems herein.
Figure 4B:
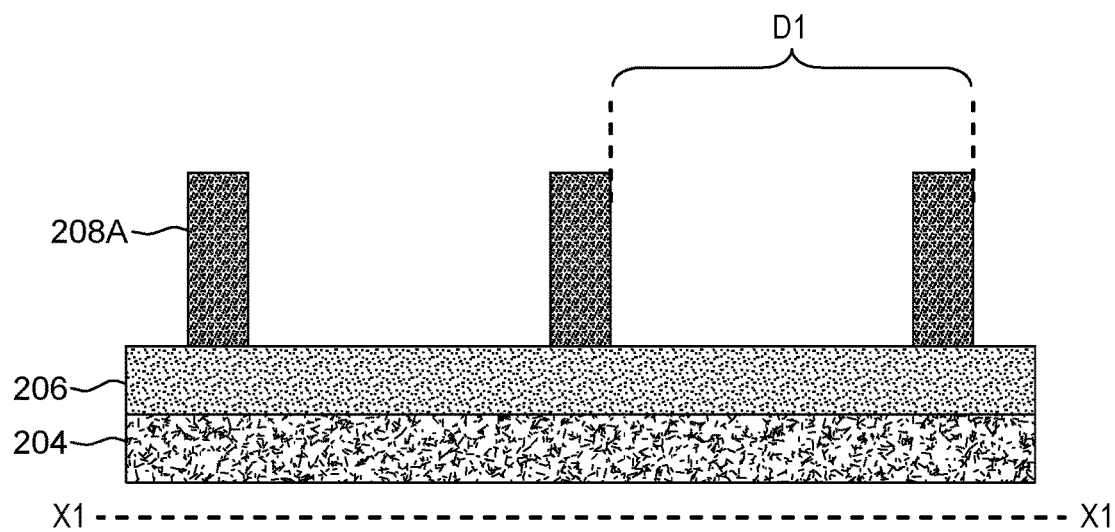
FIGS. 4B and 4C are conceptual schematic cross-sectional views along lines X1-X1 and X2-X2 in FIG. 4A of partially complete structures produced by methods and systems herein.
Figure 4C:
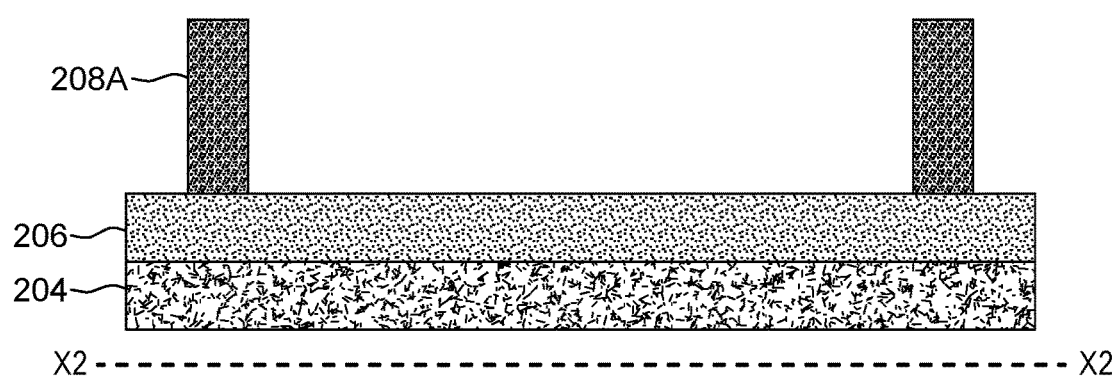

FIG. 4A is a conceptual schematic perspective view of a partially complete structure, and FIGS. 4B and 4C are conceptual schematic cross-sectional views along lines X1-X1 and X2-X2 in FIG. 4A of the same partially complete structure. FIGS. 4A-4C illustrate the structure after the asymmetric silicon layer 208 has been patterned and the optical mask structure 210-216 has been removed. Therefore, FIGS. 4A-4C illustrate the mandrels 208A formed from the asymmetric silicon layer 208 extending vertically from the horizontal silicon nitride layer 206 (where vertical and horizontal are arbitrary terms referencing perpendicular orientations or directions consistent with the arbitrary orientation shown in the drawings). Note that the edge-to-edge (same edges) distance D1 (or pitch) of the mandrels 208A is shown in FIG. 4B for reference/comparison with pitches of later formed structures.

Figure 5A:
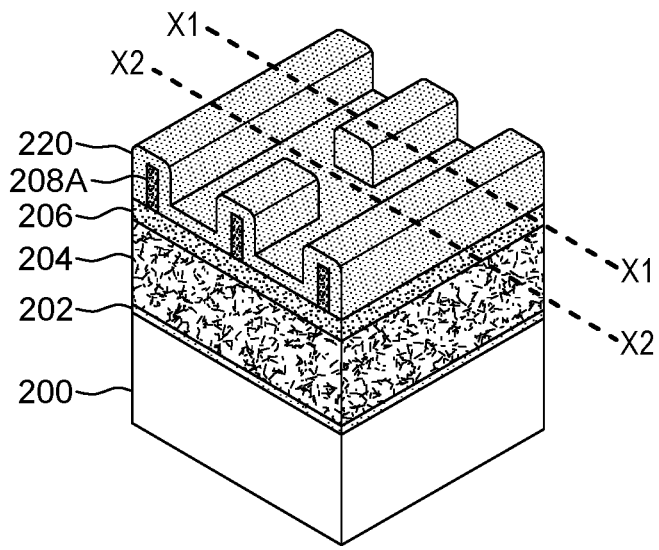
FIG. 5A is a conceptual schematic perspective view of a partially complete structure produced by methods and systems herein.
Figure 5B:
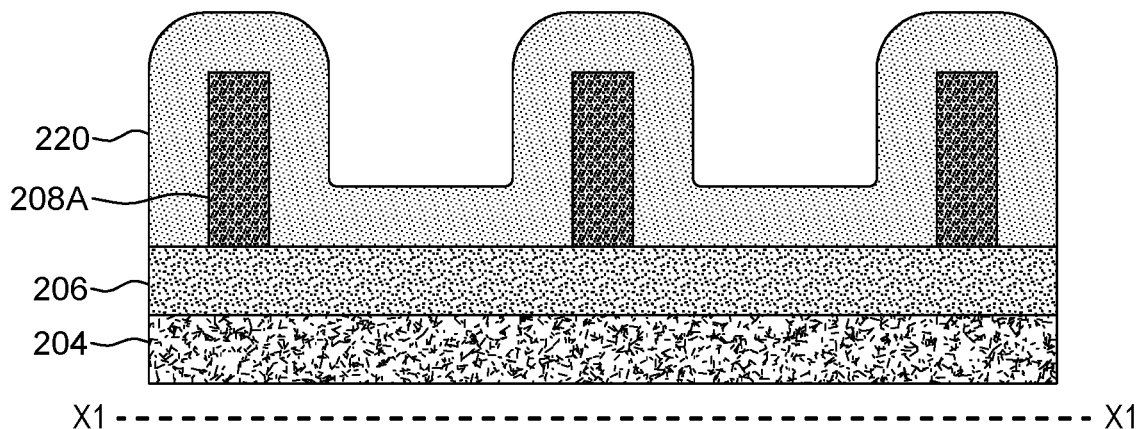
FIGS. 5B and 5C are conceptual schematic cross-sectional views along lines X1-X1 and X2-X2 in FIG. 5A of partially complete structures produced by methods and systems herein.
Figure 5C:
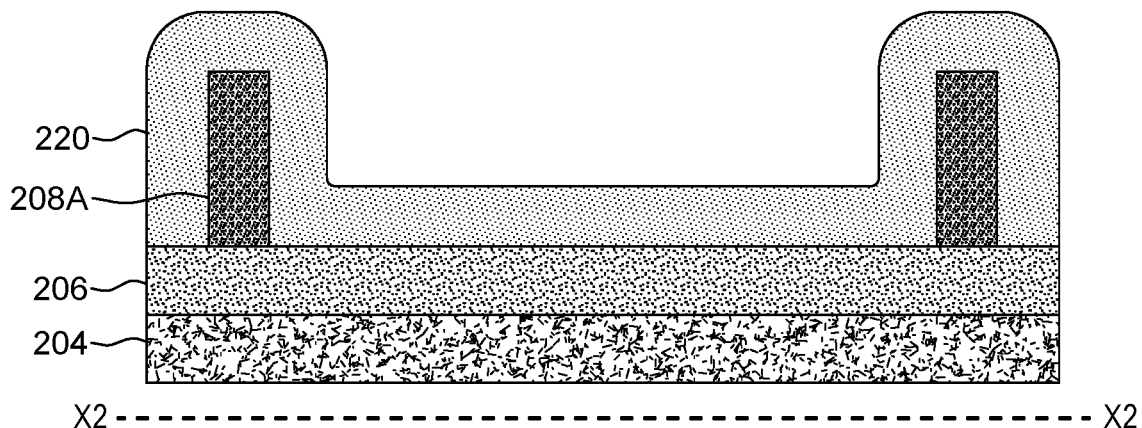

FIG. 5A is a conceptual schematic perspective view of a partially complete structure, and FIGS. 5B and 5C are conceptual schematic cross-sectional views along lines X1-X1 and X2-X2 in FIG. 5A of the same partially complete structure. FIGS. 5A-5C illustrate that methods herein conformally form a conformal material 220 (e.g., an oxide material such as titanium oxide) on the mandrels 208A and the silicon nitride layer 206, using for example atomic layer deposition (ALD) or other similar processing.

FIG. 6 is a conceptual schematic perspective view of a partially complete structure that shows methods herein form a spin-on-glass material 222 (as a fill material) on the oxide material 220. FIG. 7A is a conceptual schematic perspective view of a partially complete structure, and FIGS. 7B and 7C are conceptual schematic cross-sectional views along lines X1-X1 and X2-X2 in FIG. 7A of the same partially complete structure. FIGS. 7A-7C illustrate that methods herein planarize the spin-on-glass material 222 using chemical mechanical planarization (CMP) down to the level of the oxide material 220.

Figure 8A:
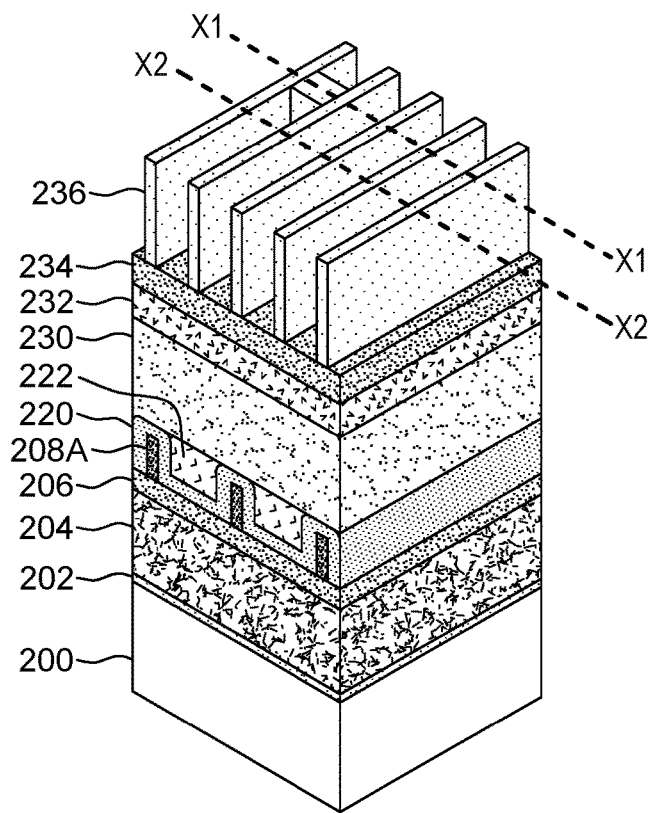
FIG. 8A is a conceptual schematic perspective views of a partially complete structure produced by methods and systems herein.
Figure 8B:
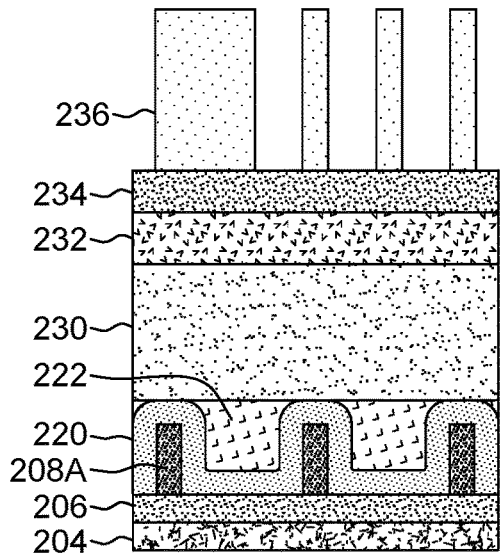
FIGS. 8B and 8C are conceptual schematic cross-sectional views along lines X1-X1 and X2-X2 in FIG. 8A of partially complete structures produced by methods and systems herein.
Figure 8C:
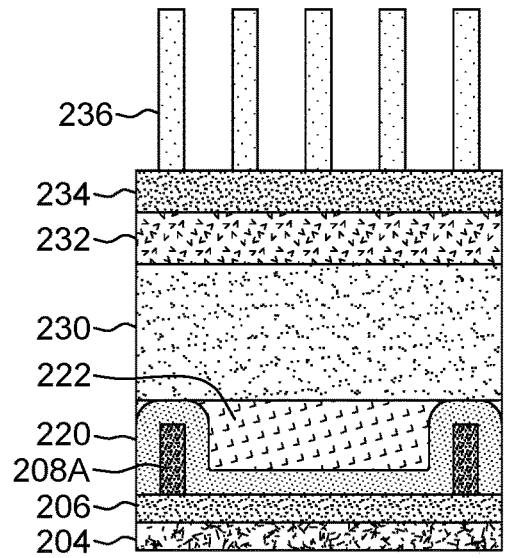

FIG. 8A is a conceptual schematic perspective view of a partially complete structure, and FIGS. 8B and 8C are conceptual schematic cross-sectional views along lines X1-X1 and X2-X2 in FIG. 8A of the same partially complete structure. FIGS. 8A-8C illustrate that methods herein pattern the spin-on-glass material 222 using reflective extreme ultraviolet (EUV) mask lithography. More specifically, FIGS. 8A-8C illustrate an absorber layer 236, a reflective layer 234, and one or more substrate layers 230, 232 of the EUV mask structure 230-236. A pattern caused by the reflective layer is transferred to the spin-on-glass material 222 using a material removal process, such as etching.

Figure 9A:
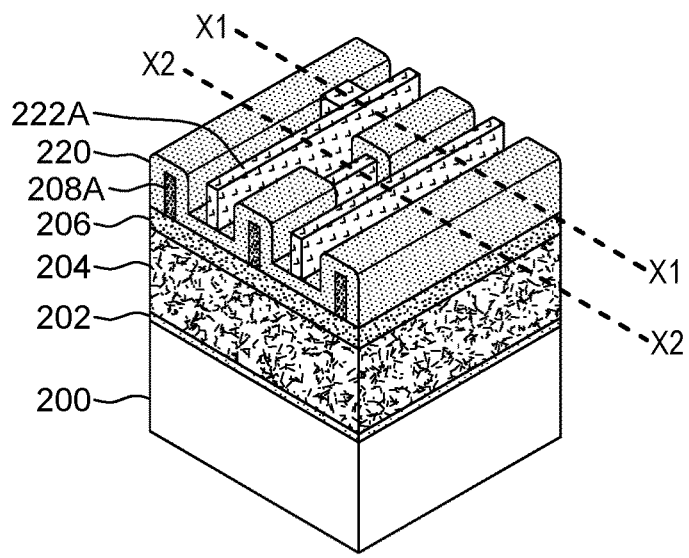
FIG. 9A is a conceptual schematic perspective views of a partially complete structure produced by methods and systems herein.
Figure 9B:
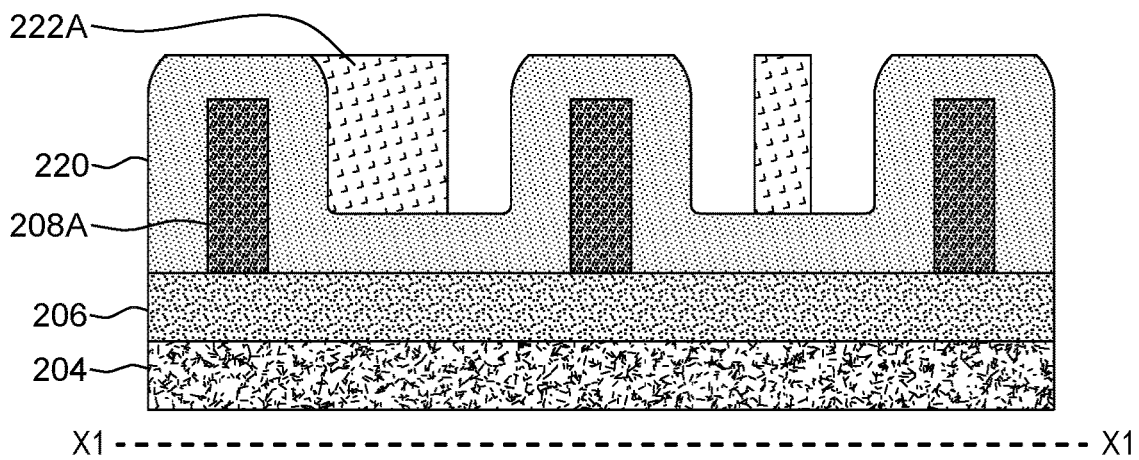
FIGS. 9B and 9C are conceptual schematic cross-sectional views along lines X1-X1 and X2-X2 in FIG. 9A of partially complete structures produced by methods and systems herein.
Figure 9C:
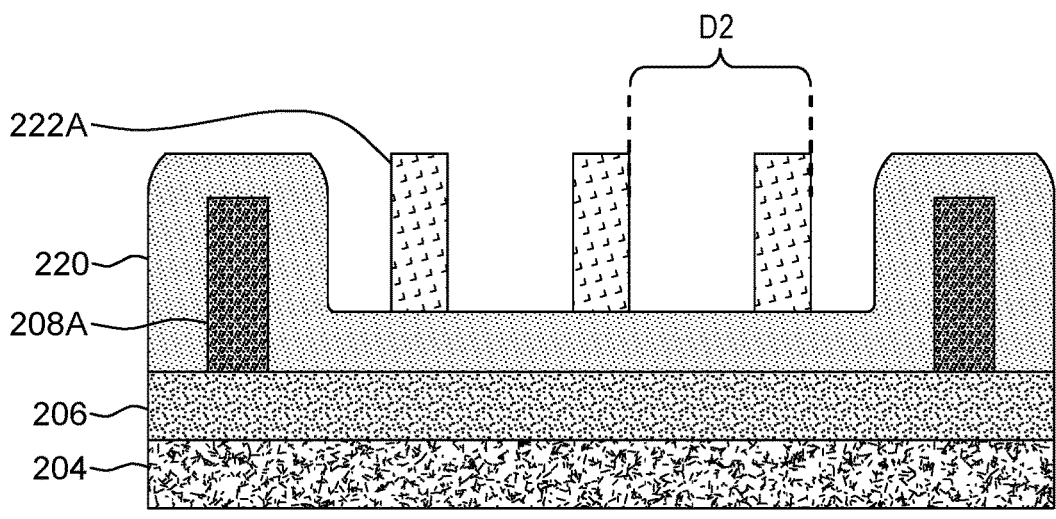

FIG. 9A is a conceptual schematic perspective view of a partially complete structure, and FIGS. 9B and 9C are conceptual schematic cross-sectional views along lines X1-X1 and X2-X2 in FIG. 9A of the same partially complete structure. FIGS. 9A-9C illustrate the structure after the EUV mask structure 230-236 has been removed. FIGS. 9A-9C illustrate that the methods herein pattern the spin-on-glass material 222 into first mask features 222A using the EUV mask 230-236 to leave the first mask features 222A between locations of the mandrels 208A. Note that the edge-to-edge (same edges) distance D2 (or pitch) of the first mask features 222A is shown in FIG. 9C for reference/comparison with pitches of other structures.

Figure 10A:
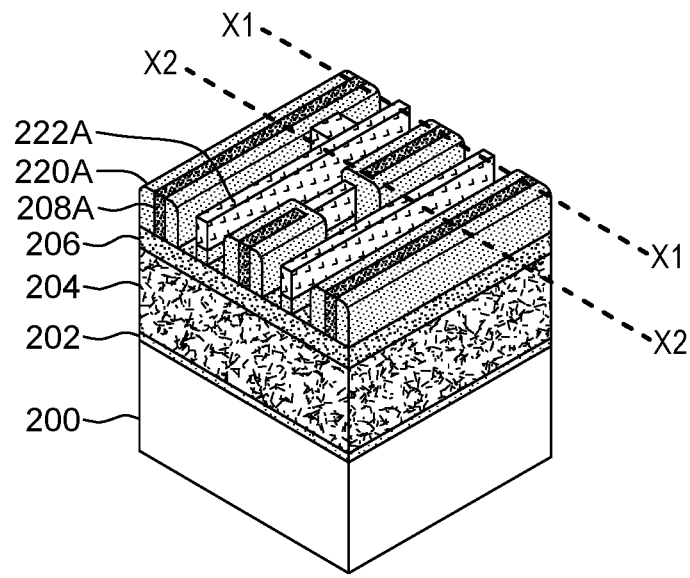
FIG. 10A is a conceptual schematic perspective views of a partially complete structure produced by methods and systems herein.
Figure 10B:
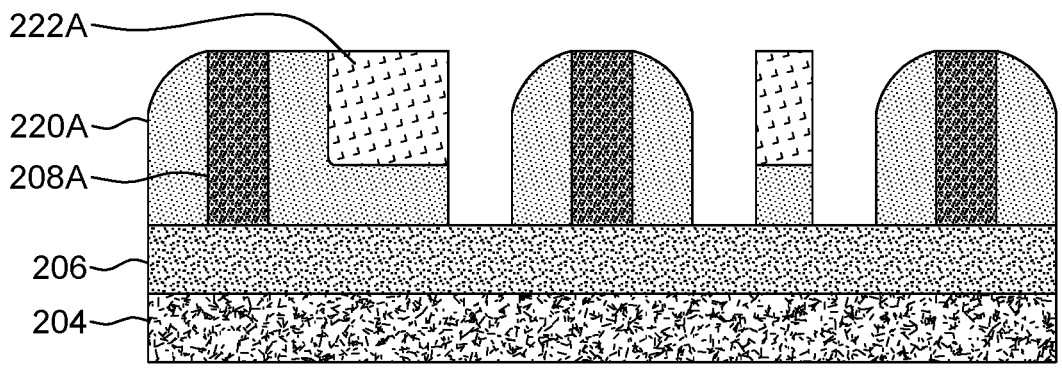
FIGS. 10B and 10C are conceptual schematic cross-sectional views along lines X1-X1 and X2-X2 in FIG. 10A of partially complete structures produced by methods and systems herein.
Figure 10C:
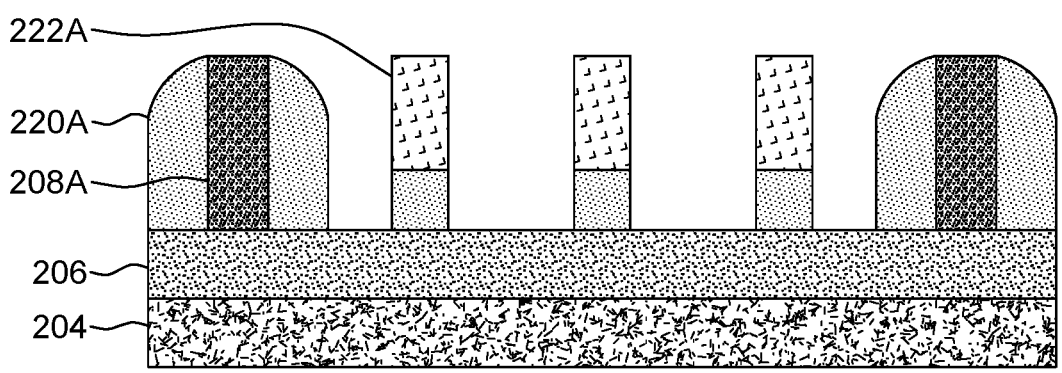

FIG. 10A is a conceptual schematic perspective view of a partially complete structure, and FIGS. 10B and 10C are conceptual schematic cross-sectional views along lines X1-X1 and X2-X2 in FIG. 10A of the same partially complete structure. FIGS. 10A-10C illustrate such methods partially etch the oxide material 220 using the silicon nitride layer 206 as an etch stop to leave the oxide material 220 on the sidewalls of the mandrels 208A as second mask features 220A in, for example, a reactive ion etching (RIE) that uses an equal ratio selectivity of the oxide material 220 to the spin-on-glass material 222. As shown in FIGS. 10A-10C, after removing portions of the spin-on-glass material 222, the first mask features 222A include a lower layer of the oxide material 220 between the silicon nitride layer 206 and the spin-on-glass material 222 (that is distal to the silicon nitride layer 206).

Figure 11A:
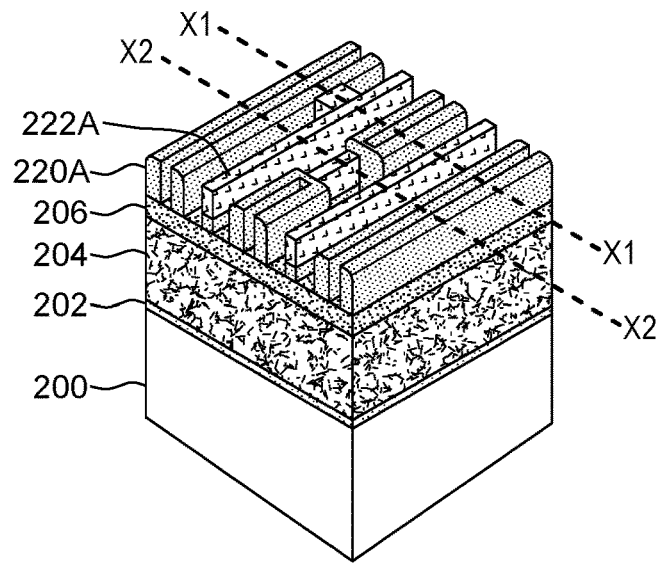
FIG. 11A is a conceptual schematic perspective views of a partially complete structure produced by methods and systems herein.
Figure 11B:
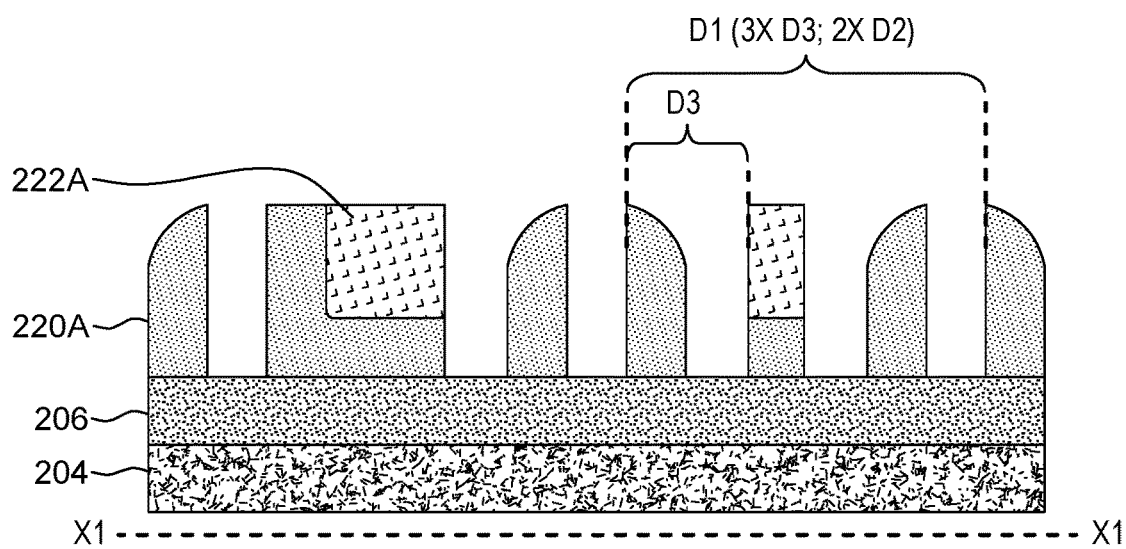
FIGS. 11B and 11C are conceptual schematic cross-sectional views along lines X1-X1 and X2-X2 in FIG. 11A of partially complete structures produced by methods and systems herein.
Figure 11C:
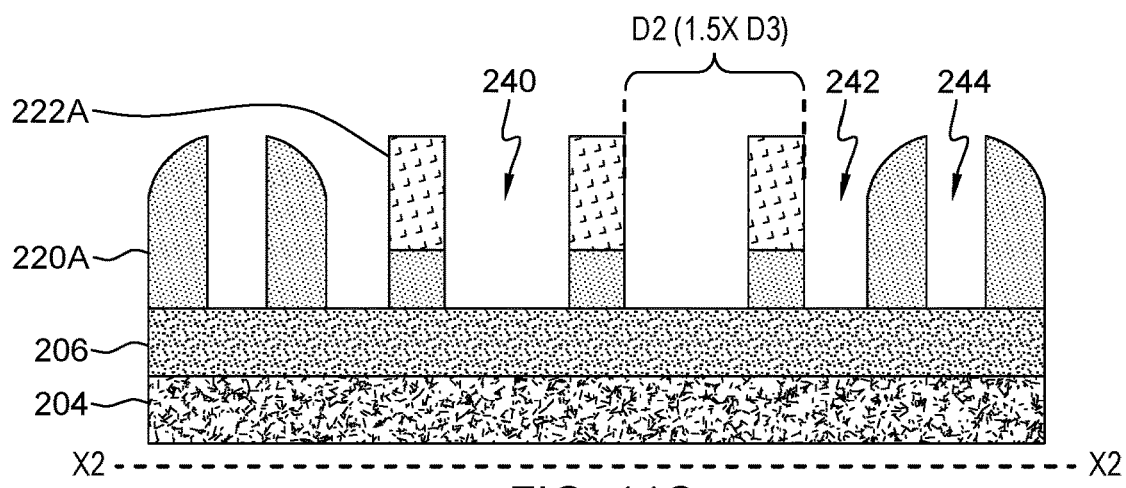

FIG. 11A is a conceptual schematic perspective view of a partially complete structure, and FIGS. 11B and 11C are conceptual schematic cross-sectional views along lines X1-X1 and X2-X2 in FIG. 11A of the same partially complete structure. FIGS. 11A-11C illustrate that the mandrels 208A are removed in a selective etching process (e.g., a selective material removal process that, for example, attacks asymmetric silicon, but leaves spin-on-glass, silicon nitride, titanium oxide, etc., mostly unaffected). As shown in FIGS. 11A-11C, the spaces between the first mask features 222A and the second mask features 220A define an etching pattern. More specifically, spaces 240 in the etching pattern are between the first mask features 222A, spaces 242 in the etching pattern are between the first mask features 222A and the second mask features 220A, and spaces 244 in the etching pattern are between the second mask features 220A.

Also, FIGS. 11B-11C illustrate that the spacing distance D1 of the mandrels 208A can be twice as large as the spacing distance D2 of the second mask features 220A (e.g., D1=2× D2) and three times larger than the spacing distance D3 of the etching pattern (e.g., D1=3×D3). Also, the spacing distance D2 of the second mask features 220A can be 1.5 times larger than spacing distance D3 of the etching pattern (e.g., D2=1.5×D3).

Note that the "pitch" of regularly spaced components is a rate of center-to-center spacing over unit distance, and therefore to be consistent with the concept of pitch, the term "spacing distance" as used herein is the center-to-center or edge-to-edge (same edges) distance of features herein. If the spacing distance D3 is the "minimum pitch" for a given technology, this means that the technology will only be allowed to be used with designs and equipment that attempt to form features with center-to-center spacing that is equal to or greater than the minimum allowed pitch or spacing distance D3. With D3 set as the minimum allowed pitch for a technology, the methods and systems can reliably form high-resolution patterns using spacing distance D1 as a minimum allowed design spacing for optical lithographically formed features, and spacing distance D2 as a minimum allowed design spacing for EUV lithographically formed features because such measures D1 and D2 are known to produce features within acceptable tolerances.

The foregoing ratios between D1, D2, and D3 allow the systems and methods herein to consistently produce high-resolution patterned structures because the spacing distance D3 is set to reliably (comfortably or easily) maintain high-resolution patterns when performing optical lithography and the spacing distance D2 is set to reliably (comfortably or easily) maintain high-resolution patterns when performing EUV lithography, while the sidewall image transfer technology allows the combination of such first and second mask features 222A, 220A to produce an even smaller minimum pitch (spacing distance D3). In other words, by using the foregoing ratios, these processes reliably (comfortably or easily) form structures such that a desired yield percentage will always be met or exceeded (or a desired defect percentage will always be met or not exceeded).

Figure 12:
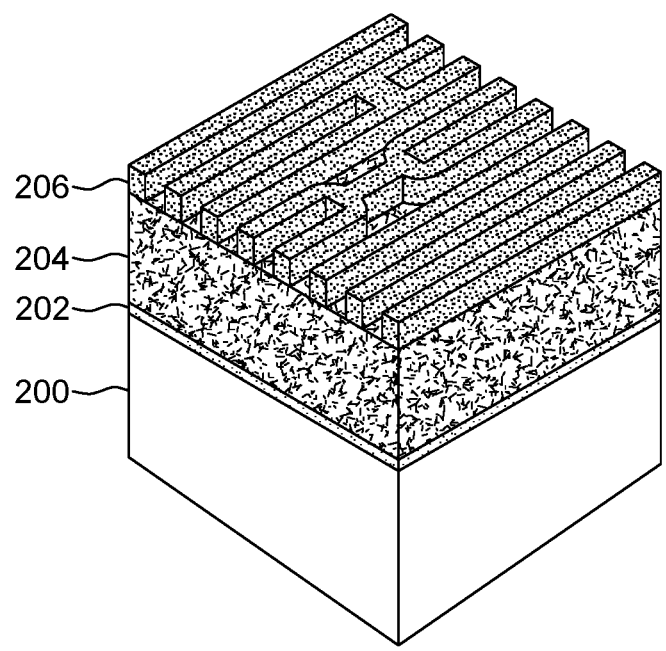
FIG. 12 is a conceptual schematic perspective view of a partially complete structure produced by methods and systems herein.

FIG. 12 is a conceptual schematic perspective view of a partially complete structure that shows methods herein remove portions of the silicon nitride layer 206 not protected by the first mask features 222A and the second mask features 220A to transfer the etching pattern into the silicon nitride layer 206. As also shown in FIG. 12, methods herein remove the first mask features 222A and second mask features 220A and then etch the underlying insulator layer 204 through the etching pattern in the silicon nitride layer 206 to transfer openings matching the etching pattern into the underlying insulator layer 204.

Figure 13A:
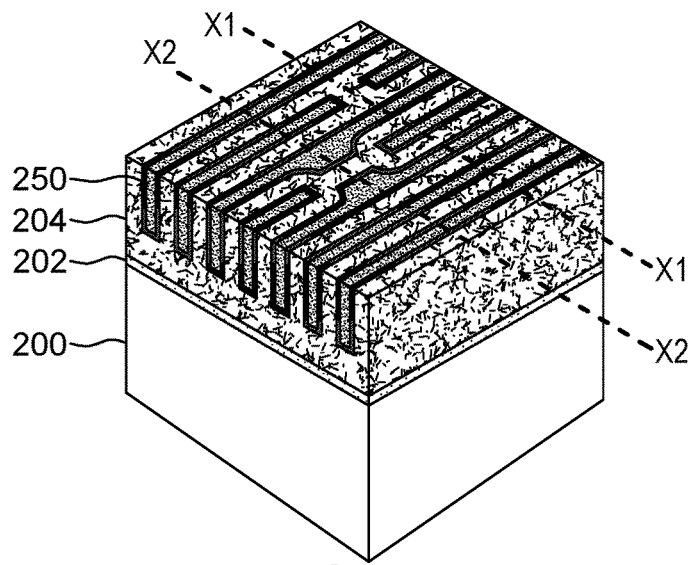
FIG. 13A is a conceptual schematic perspective views of a partially complete structure produced by methods and systems herein.
Figure 13B:
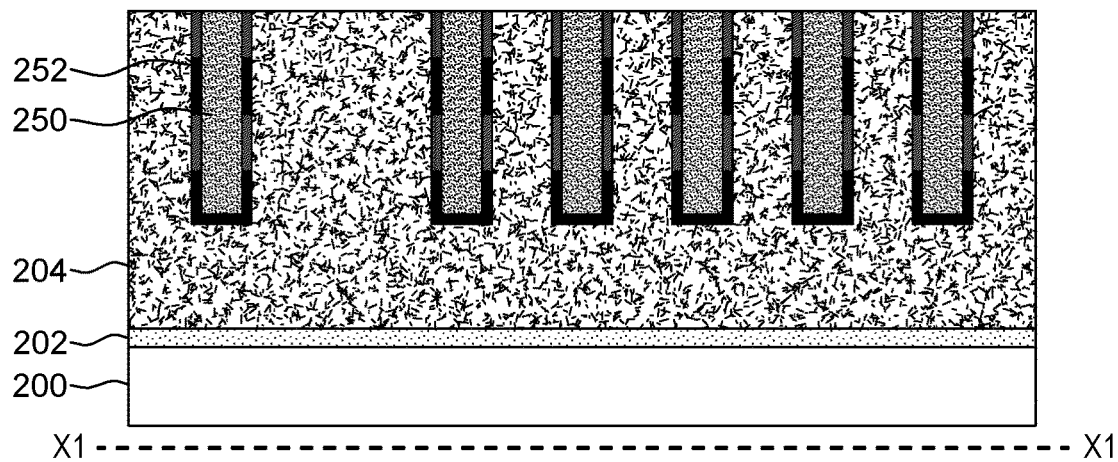
FIGS. 13B and 13C are conceptual schematic cross-sectional views along lines X1-X1 and X2-X2 in FIG. 13A of partially complete structures produced by methods and systems herein.
Figure 13C:
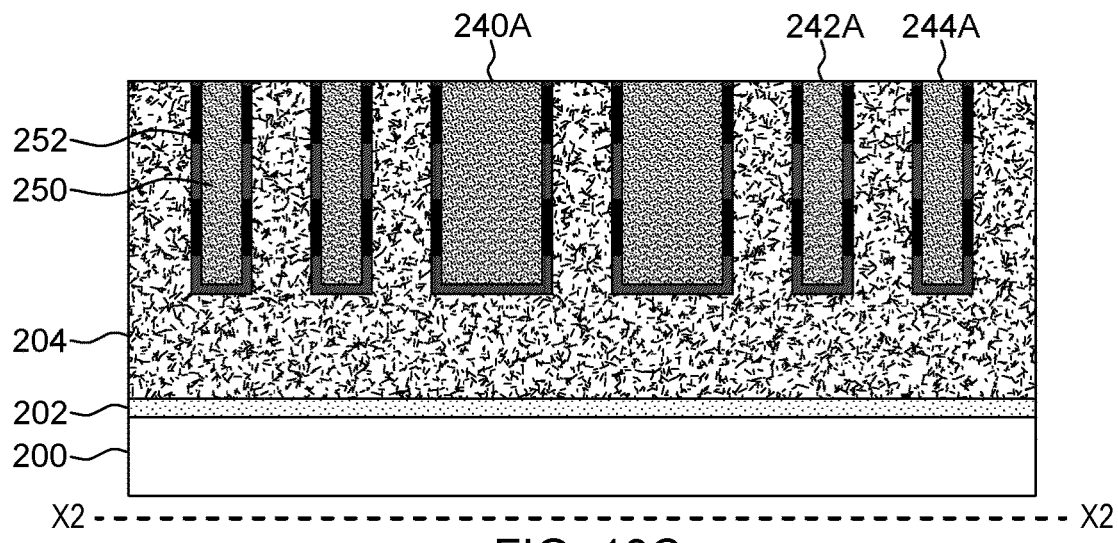

FIG. 13A is a conceptual schematic perspective view of a partially complete structure, and FIGS. 13B and 13C are conceptual schematic cross-sectional views along lines X1-X1 and X2-X2 in FIG. 13A of the same partially complete structure. FIGS. 13A-13C illustrate that the methods fill the openings in the underlying insulator layer 204 with a liner 252 and a conductor (e.g., metal material 250 or other material) to form wiring in the underlying insulator layer 204 having a wiring pattern matching the etching pattern.

Figure 14:
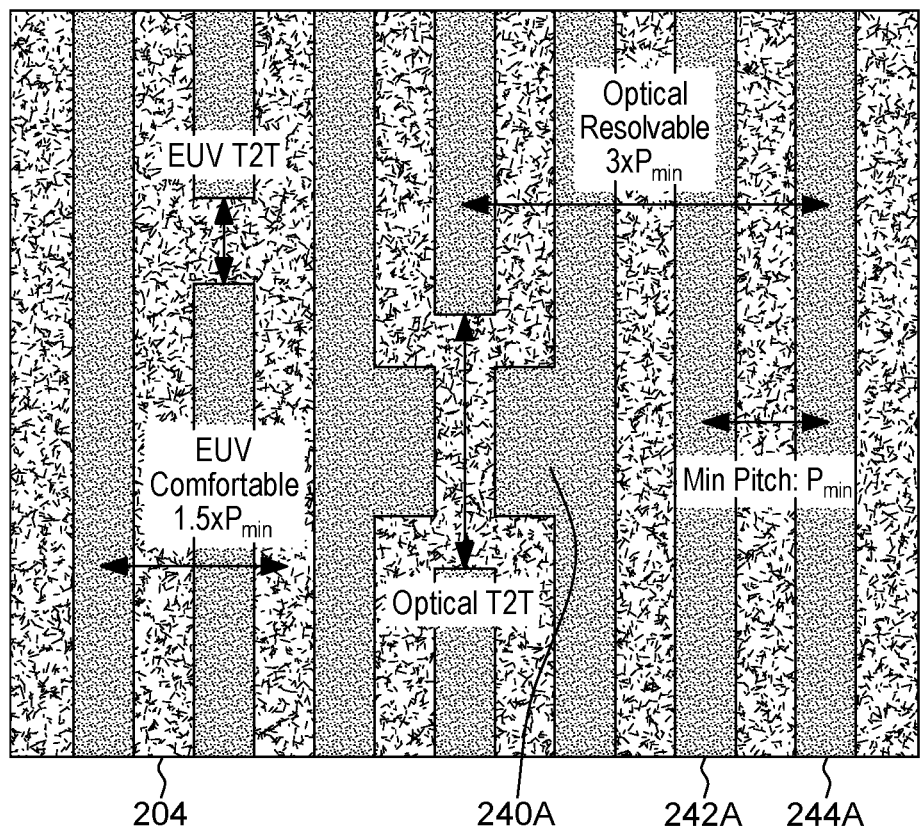
FIG. 14 is a conceptual schematic top view of a partially complete structure produced by methods and systems herein.

FIG. 14 is a conceptual schematic top view of the wiring layer shown in FIG. 13A. FIGS. 13C and 14 illustrate portions of the patterned metal material 250 using identification numbers 240A, 242A, and 244A. Item 240A represents the portion of the patterned metal material 250 formed in the space 240 shown in FIG. 11C. Similarly, item 242A represents the portion of the patterned metal material 250 formed in the space 242 shown in FIG. 11C, and item 244A represents the portion of the patterned metal material 250 formed in the space 244 shown in FIG. 11C.

As shown in FIG. 14, the ratios between spacing distances D1, D2, and D3 produce high-resolution patterned structures because the optically resolvable elements are set at 3 times minimum pitch ($3 \times P_{min}$) to reliably (comfortably or easily) maintain high-resolution patterns and the EUV resolvable elements are set at 1.5 times minimum pitch ($1.5 \times P_{min}$) to reliably (comfortably or easily (within desired yield/defect percentage)) maintain high-resolution patterns, while the sidewall image transfer technology allows the combination of such to produce an even smaller minimum pitch ($P_{min}$). FIG. 14 also shows that some line ends can be spaced (tip-2-tip (T2T)) with the EUV spacing distance D2 (EUV T2T) and that other line ends can be spaced with the optical spacing distance D3 (Optical T2T) to provide flexibility in locations and sizes of line cuts/ends. Thus, the methods and systems herein allow different T2T spacing merely by forming line cuts using either optical or EUV lithography.

Figure 15:
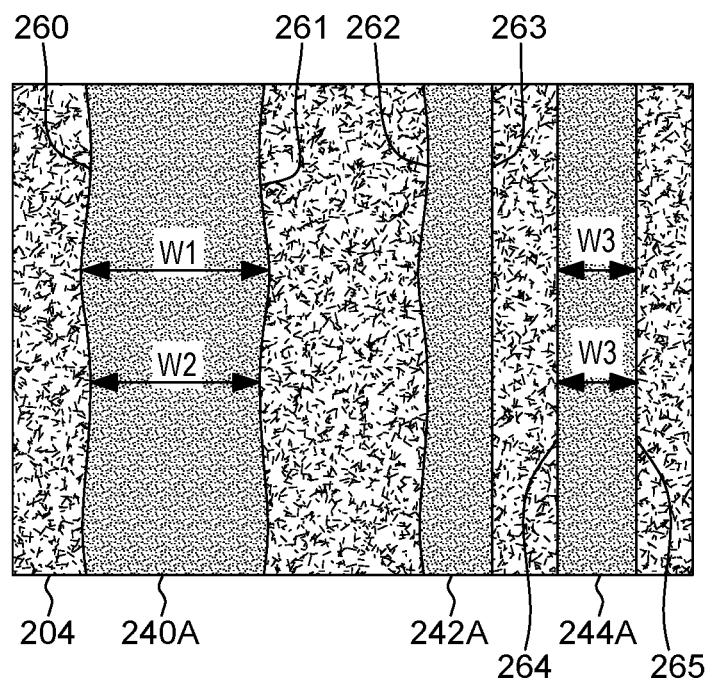
FIG. 15 is a conceptual schematic top view of a portion of the top view of the wiring layer shown in FIG. 14.

FIG. 15 is an enlarged top view of a portion of the top view of the wiring layer shown in FIG. 14 and again illustrates portion 240A, 242A, and 244A of the patterned metal material 250 within the underlying insulator layer 204. As noted above, the resolution of the optical lithography is higher than the resolution of the EUV lithography, which results in irregularities in the wiring pattern 250 in the underlying layer 204. Such irregularities occur because some of the sidewalls of the wires in the wiring pattern are patterned according to the higher-resolution optical lithography, while other sidewalls are patterned with the lower resolution EUV lithography.

For example, the sidewalls of opening 240 in FIG. 11C are patterned with EUV lithography (first mask features 222A) which can result in the resulting portion 240A of the patterned metal material 250 shown in FIG. 15 not having completely straight sidewalls 260, 261, resulting in inconsistent widths W1, W2 along the length of the wiring line portion 240A. Note that the irregularities in the sidewalls in FIG. 15 are exaggerated for demonstration purposes. In contrast, there are few if any irregularities in the sidewalls 264, 265 of the portion 244A of the patterned metal material 250 in FIG. 15 resulting from opening 244 in FIG. 11C because the sidewalls of opening 244 result from optical lithography in combination with sidewall image transfer technology (second mask features 220A), resulting in a consistent width W3 along the length of the wiring line portion 244A.

FIG. 15 also shows that the portion 242A of the patterned metal material 250 in FIG. 15 resulting from opening 242 in FIG. 11C can have one sidewall 262 (that is formed with EUV lithography) that has a larger number of irregularities, but a second sidewall 263 (formed with optical lithography) that lacks such a larger number of irregularities. More specifically, as shown in FIG. 11C, one sidewall of opening 242 is a first mask feature 222 formed using EUV lithography while the other sidewall of opening 242 is a second mask feature 220 formed using optical lithography.

Figure 16:
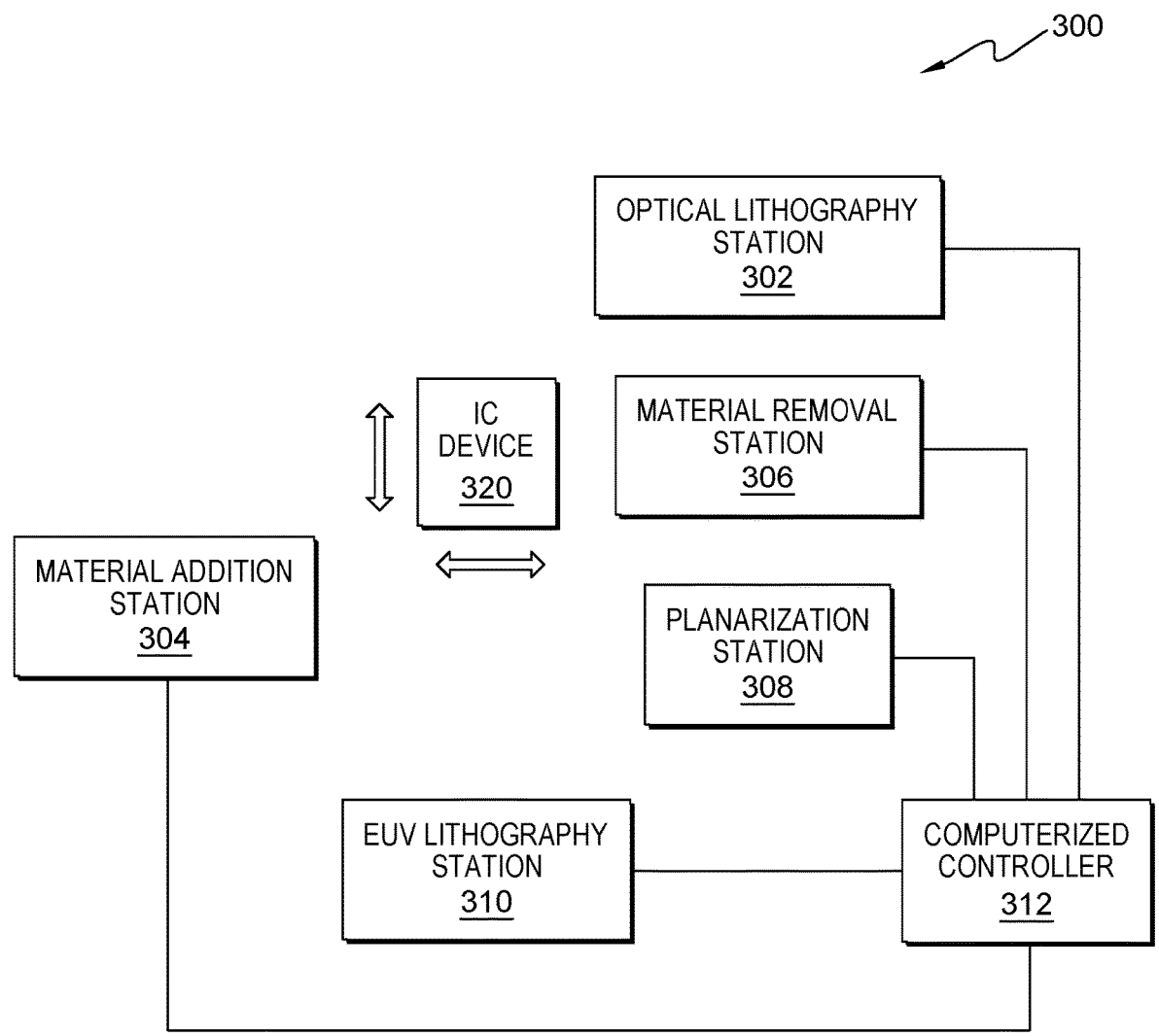
FIG. 16 is a schematic diagram of a manufacturing system according to embodiments herein.

FIG. 16 is a conceptual schematic diagram of a system 300 herein that includes, among other components, an optical mask lithography station 302 configured to pattern a sacrificial material on an etch mask material into mandrels, wherein the etch mask material is on an underlying layer. Such systems 300 also include one or more material addition stations 304, one or more of which can be configured as an atomic layer deposition (ALD) station to form a conformal material on the mandrels and the etch mask material. Ones of such material addition stations 304 can also be configured to form a fill material on the conformal material.

These systems 300 have one or more planarization stations 308 configured to planarize the fill material to a level of the conformal material. Also included is an extreme ultraviolet (EUV) mask lithography station 310 that is configured to pattern the fill material into first mask features, and this leaves the fill material between locations of the mandrels.

Such systems 300 further include at least one material removal station 306 configured to partially remove the conformal material to leave the conformal material on sidewalls of the mandrels as second mask features. The first mask features can be formed parallel to the second mask features, and the first mask features can be formed co-linear with the second mask features.

Further, the material removal station 306 can be configured to remove the mandrels. The spaces between the first mask features and the second mask features define an etching pattern. The material removal station 306 can be configured to remove portions of the etch mask material not protected by the first mask features and the second mask features to transfer the etching pattern into the etch mask material. The material removal station 306 can also be configured to remove the first mask features and second mask features and to etch the underlying layer through the etching pattern in the etch mask material to transfer openings matching the etching pattern into the underlying layer. The material addition station 304 is additionally configured to fill the openings with a conductor to form wiring in the underlying layer having a wiring pattern matching the etching pattern.

All such operations are controlled by a computerized controller 312 which uses an internal processor executing applications of instructions to automate all such operations, eliminating the need for user intervention in the processing. Additionally, such systems produce a final, customer-deliverable integrated circuit (IC) device 320 by moving the IC device 320 between the various stations at different times. Note that while FIG. 16 only illustrates one of each of the previously mentioned stations 302-310, multiples of foregoing stations can be included in the system to increase processing efficiency or perform specialized tasks. In addition, many of the foregoing stations can be combined into a single station that can be configured to perform different functions at different times. The IC device 320 includes the previously described wiring within an insulator layer, and in addition such systems 300 are utilized to create other components within the IC device 320, including, transistors, capacitors, wiring layers, contacts, packaging, etc., to produce a final, customer-deliverable device 320.

Therefore, these methods and systems produce integrated circuit structures 320 (FIG. 16) that include, among other components, an underlying (wiring) layer 204 within a plurality of laminated layers 200-204, etc.) shown in FIGS. 13A-15. The wiring layer has wiring lines 250 within an insulator 204 and a liner 252 between the insulator 205 and the wiring lines 250. In one example, the wiring lines 250 can include what are referred to as wider "first" conductive lines 240A and relatively more narrow "second" conductive lines 242A, 244A, where the first conductive lines 240A have a larger number of irregularities relative to the second conductive lines 242A, 244A. In one example, the pitch of the first conductive lines 240A is 1.5 times a pitch of the second conductive lines 242A, 244A.

More specifically, such larger number of irregularities includes inconsistently shaped sidewalls 260, 261 along lengths of the first conductive lines 240A relative to shapes of sidewalls 263-265 of the second conductive lines 242A, 244A. Also, and the first conductive lines 240A can have less consistent widths (wider W1 vs. narrower W2 in FIG. 15) relative to widths (same consistent width W3) of some of the second conductive lines 244A. With respect to this larger number of irregularities, certain ones of the more narrow second conductive lines 242A can have one sidewall 262 (that is formed with EUV lithography) that has a larger number of irregularities, but a second sidewall 263 (formed with optical lithography) that lacks such a larger number of irregularities.

Therefore, the systems and methods herein maintain the advantages of both optical lithography and EUV lithography by utilizing sidewall spacers formed on features patterned with optical lithography in combination with features patterned using EUV lithography in a specific pitch ratio to produce high-resolution crisp features with sizes comparable to features produced by leading edge EUV-only lithography systems. This allows the systems and methods herein to pattern features that have small EUV lithography pattern features, while still maintaining the higher resolution produced by optical lithography systems.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance. Also, the materials herein can be deposited or grown, where epitaxial growth occurs in a heated (and sometimes pressurized) environment that is rich with a gas of the material that is to be grown.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art. Also, a hardmask can be formed of any suitable material, whether now known or developed in the future, such as a nitride, metal, or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
    patterning a sacrificial material on an etch mask material into mandrels using optical lithography, wherein the etch mask material is on an underlying layer;
    forming a conformal material on the mandrels and the etch mask material;
    forming a fill material on the conformal material;
    patterning the fill material into first mask features using extreme ultraviolet (EUV) lithography;
    partially removing the conformal material to leave the conformal material on sidewalls of the mandrels as second mask features, wherein spaces between the first mask features and the second mask features define an etching pattern;
    removing portions of the etch mask material not protected by the first mask features and the second mask features to transfer the etching pattern into the etch mask material;
    removing the first mask features and second mask features; and
    etching the underlying layer through the etching pattern in the etch mask material to transfer the etching pattern into the underlying layer.

2. The method according to claim 1, wherein a first spacing distance of the mandrels is twice as large as a second spacing distance of the second mask features.

3. The method according to claim 1, wherein a first spacing distance of the mandrels is 3 times larger than the first mask features and the second mask features defining spacing distance of the etching pattern, and wherein a second spacing distance of the second mask features is 1.5 times larger than spaces between the first mask features and the second mask features defining spacing distance of the etching pattern.

4. The method according to claim 1, wherein the patterning of the fill material leaves the fill material between locations of the mandrels.

5. The method according to claim 1, further comprising planarizing the fill material to a level of the conformal material before performing the patterning of the fill material.

6. The method according to claim 1, wherein ones of the first mask features are formed parallel to the second mask features.

7. The method according to claim 1, wherein ones of the first mask features are formed co-linear with the second mask features.

8. A method comprising:
    patterning a silicon layer on a silicon nitride layer into mandrels using light-blocking mask optical lithography, wherein the silicon nitride layer is on a dielectric layer;
    forming an oxide material on the mandrels and the silicon nitride layer;
    forming a spin-on-glass material on the oxide material;
    patterning the spin-on-glass material into first mask features using extreme ultraviolet (EUV) reflective lithography, wherein the first mask features include a lower layer of the oxide material between the silicon nitride layer and the spin-on-glass material that is distal to the silicon nitride layer;
    partially etching the oxide material using the silicon nitride layer as an etch stop to leave the oxide material on sidewalls of the mandrels as second mask features;
    removing the mandrels, wherein spaces between the first mask features and the second mask features define an etching pattern, and wherein a first spacing distance of the mandrels is larger than a second spacing distance of the second mask features;
    removing portions of the silicon nitride layer not protected by the first mask features and the second mask features to transfer the etching pattern into the silicon nitride layer;
    removing the first mask features and second mask features;
    etching the dielectric layer through the etching pattern in the silicon nitride layer to transfer openings matching the etching pattern into the dielectric layer; and
    filling the openings with a metal to form wiring in the dielectric layer having a wiring pattern matching the etching pattern.

9. The method according to claim 8, wherein a first spacing distance of the mandrels is twice as large as a second spacing distance of the second mask features.

10. The method according to claim 8, wherein a first spacing distance of the mandrels is 3 times larger than spacing distance of the etching pattern, and wherein a second spacing distance of the second mask features is 1.5 times larger than the spacing distance of the etching pattern.

11. The method according to claim 8, wherein the patterning of the spin-on-glass material leaves the spin-on-glass material between locations of the mandrels.

12. The method according to claim 8, further comprising planarizing the spin-on-glass material using chemical mechanical planarization (CMP) to a level of the oxide material before performing the patterning of the spin-on-glass material.

13. The method according to claim 8, wherein ones of the first mask features are formed between and parallel to the second mask features.

14. The method according to claim 8, wherein ones of the first mask features are formed co-linear with the second mask features.

15. An integrated circuit structure comprising:
    a wiring layer within a plurality of layers,
    wherein the wiring layer comprises wiring lines within an insulator,
    wherein the wiring lines comprise first conductive lines and second conductive lines,
    wherein the first conductive lines are wider than the second conductive lines, and
    wherein the first conductive lines have a larger number of irregularities relative to the second conductive lines,
    wherein the first conductive lines result from first mask features being formed using extreme ultraviolet (EUV) reflective lithography,
    wherein the second conductive lines result from second mask features being formed using optical lithography and sidewall image transfer (SIT) techniques,
    wherein the first mask features are formed using an EUV reflective lithography patterned and planarized fill material on a conformal material,
    wherein the conformal material is formed on an etch mask,
    wherein the second mask features are formed as sidewall features on sacrificial mandrels on the etch mask using the SIT techniques, wherein the sacrificial mandrels are formed using the optical lithography, and wherein the etch mask is used to pattern the first conductive lines and the second conductive lines.

16. The integrated circuit structure according to claim 15, wherein the larger number of irregularities include inconsistently shaped sidewalls along lengths of the first conductive lines relative to shapes of sidewalls of the second conductive lines.

17. The integrated circuit structure according to claim 15, wherein the larger number of irregularities include the first conductive lines having relatively less consistent widths relative to widths of the second conductive lines.

18. The integrated circuit structure according to claim 15, wherein the larger number of irregularities include ones of the second conductive lines having a first sidewall with the larger number of irregularities and a second sidewall lacking the larger number of irregularities.

19. The integrated circuit structure according to claim 15, wherein a pitch of the first conductive lines is 1.5 times a pitch of the second conductive lines.

20. The integrated circuit structure according to claim 15, further comprising a liner between the insulator and the wiring lines.

* * * * *